United States Patent
Zeng (12)

(10) Patent No.: US 11,374,197 B2
(45) Date of Patent: Jun. 28, 2022

(54) ORGANIC LIGHT-EMITTING DIODE OLED PANEL HAVING ISOLATOR ASSEMBLIES FOR PREVENTING LIGHT LEAKAGE

(71) Applicant: SHENZHEN CHINA STAR OPTOELECTRONICS SEMICONDUCTOR DISPLAY TECHNOLOGY CO., LTD., Guangdong (CN)

(72) Inventor: Weijing Zeng, Guangdong (CN)

(73) Assignee: SHENZHEN CHINA STAR OPTOELECTRONICS SEMICONDUCTOR DISPLAY TECHNOLOGY CO., LTD, Guangdong (CN)

( * ) Notice: Subject to any disclaimer, the term of this patent is extended or adjusted under 35 U.S.C. 154(b) by 297 days.

(21) Appl. No.: 16/614,806

(22) PCT Filed: May 5, 2019

(86) PCT No.: PCT/CN2019/085510
§ 371 (c)(1),
(2) Date: Nov. 19, 2019

(87) PCT Pub. No.: WO2020/206771
PCT Pub. Date: Oct. 15, 2020

(65) Prior Publication Data
US 2022/0006047 A1    Jan. 6, 2022

(30) Foreign Application Priority Data

Apr. 8, 2019    (CN) .......................... 201910276888.4

(51) Int. Cl.
*H01L 29/08*    (2006.01)
*H01L 51/52*    (2006.01)
*H01L 27/32*    (2006.01)

(52) U.S. Cl.
CPC ...... *H01L 51/5253* (2013.01); *H01L 27/3213* (2013.01); *H01L 27/3246* (2013.01);
(Continued)

(58) Field of Classification Search
CPC ............. H01L 51/5253; H01L 51/5221; H01L 51/5206; H01L 27/3246; H01L 27/32262; H01L 27/3213; H01L 2251/558
See application file for complete search history.

(56) References Cited

U.S. PATENT DOCUMENTS

2006/0017375 A1    1/2006 Noguchi et al.
2007/0153222 A1*   7/2007 Jo ....................... H01L 27/1288
                                                              349/187

(Continued)

FOREIGN PATENT DOCUMENTS

CN    104681588 A    6/2015
CN    105590954 A    5/2016

(Continued)

*Primary Examiner* — Phuc T Dang
(74) *Attorney, Agent, or Firm* — Soroker Agmon Nordman

(57) ABSTRACT

An organic light emitting diode (OLED) panel includes a thin film transistor (TFT) array substrate, a plurality of OLED devices, and a plurality of isolator assemblies. The TFT array substrate includes a plurality of pixel regions, and the OLED devices disposed on locations corresponding to the pixel regions respectively. The OLED devices include an OLED layer. The isolator assemblies are configured to block the OLED layer of a white light-emitting device from extending to the OLED devices adjacent to the white light-emitting device. By arranging the isolator assemblies around the white light-emitting device, light generated by the white light-emitting device is prevented from leaking.

20 Claims, 2 Drawing Sheets

(52) U.S. Cl.
CPC ...... *H01L 27/3262* (2013.01); *H01L 51/5206* (2013.01); *H01L 51/5221* (2013.01); *H01L 2251/558* (2013.01)

(56) References Cited

U.S. PATENT DOCUMENTS

| | | | |
|---|---|---|---|
| 2007/0194696 A1* | 8/2007 | Hsu | H01L 51/5271 |
| | | | 313/504 |
| 2013/0099218 A1 | 4/2013 | Lee et al. | |
| 2015/0144902 A1 | 5/2015 | Do et al. | |
| 2018/0375052 A1* | 12/2018 | Yang | H01L 51/5036 |
| 2020/0066815 A1 | 2/2020 | Choi et al. | |

FOREIGN PATENT DOCUMENTS

| | | |
|---|---|---|
| CN | 106449726 A | 2/2017 |
| WO | 2018212960 A1 | 11/2018 |

\* cited by examiner

ORGANIC LIGHT-EMITTING DIODE OLED PANEL HAVING ISOLATOR ASSEMBLIES FOR PREVENTING LIGHT LEAKAGE

FIELD OF INVENTION

The present invention relates to a display field and, more particularly, to an organic light emitting diode (OLED) panel.

BACKGROUND OF INVENTION

Organic light-emitting diodes (OLEDs) are exceptional in terms of self-illumination, brightness, viewing angles, contrast, flexibility, power consumption, etc. Therefore, the OLEDs have been spotlighted as a new generation in display technology. A large-size OLED television is a goal pursued by all major panel manufacturers. To realize a larger-size and high-resolution OLED product, white light-emitting devices are generally used.

Referring to FIG. 1, a conventional white light-emitting device includes a substrate 1', a thin film transistor (TFT) array layer 2', a planarization layer 3', a cathode 4', a pixel-defining layer 5', a luminescent layer 6, and an anode 7'.

Because a distance between two high-resolution sub-pixels is short and charge carriers in a charge generation layer (CGL) of an OLED device have high mobility, the charge carriers are prone to lateral migration. Furthermore, since the cathode covers the whole OLED device, the OLED device is prone to lateral light leakage, thereby reducing color gamut and display quality of the OLED device.

SUMMARY OF INVENTION

The present invention provides an organic light-emitting diode (OLED) panel to solve a technical problem that a white light-emitting device of a conventional OLED panel is prone to lateral light leakage.

The present invention provides an OLED panel including a thin film transistor (TFT) array substrate, wherein the TFT array substrate includes a plurality of pixel regions spaced apart from each other; a plurality of OLED devices disposed on locations corresponding to the pixel regions respectively, wherein each of the OLED devices includes a white light-emitting device; and a plurality of isolator assemblies disposed around the white light-emitting device.

The OLED panel further includes an OLED layer. The isolator assemblies are configured to block the OLED layer located on the white light-emitting device from extending to the OLED devices adjacent to the white light-emitting device.

A height of each of the isolator assemblies is greater than a thickness of the OLED layer.

The OLED layer includes a hole injection layer, a hole transport layer, a charge generation layer, a luminescent layer, an electron transport layer, and an electron injection layer which are sequentially disposed on each other.

In the OLED panel of the present invention, the OLED devices are arranged in a matrix, whereby the OLED devices are arranged in a row along a first direction and arranged in a column along a second direction.

A first spacing between two of the OLED devices in the first direction is less than a second spacing between two of the OLED devices in the second direction.

The isolator assemblies are disposed at two sides of the white light-emitting device in the first direction.

In the OLED panel of the present invention, the OLED panel further includes an auxiliary cathode layer. The auxiliary cathode layer is disposed at two ends of each of the OLED devices in the row and is extending in the same direction as the first direction.

In the OLED panel of the present invention, the OLED panel includes the TFT array substrate; an anode; a pixel-defining layer having a plurality of notches; the plurality of isolator assemblies; the OLED layer; a cathode; and the auxiliary cathode layer which are sequentially disposed on each other.

Each of the isolator assemblies is disposed on the pixel-defining layer among the notches.

In the OLED panel of the present invention, the white light-emitting device, the OLED layer between two adjacent OLED devices, and the anode are isolated by the isolator assemblies in the first direction.

In the OLED panel of the present invention, the anode is electrically connected to the auxiliary cathode layer.

In the OLED panel of the present invention, a length of each of the isolator assemblies is greater than or equal to a length of the white light-emitting device.

In the OLED panel of the present invention, each of the isolator assemblies is strip-shaped, and the longitudinal cross-sectional shape of each of the isolator assemblies has a wide top and a narrow bottom.

The present invention further provides an OLED panel, including: a thin film transistor (TFT) array substrate, wherein the TFT array substrate includes a plurality of pixel regions spaced apart from each other; a plurality of OLED devices disposed on locations corresponding to the pixel regions respectively, where each of the OLED devices includes a white light-emitting device; and a plurality of isolator assemblies disposed around the white light-emitting device.

The OLED panel includes an OLED layer. The isolator assemblies are configured to block the OLED layer located on the white light-emitting device from extending to the OLED devices adjacent to the white light-emitting device. A height of each of the isolator assemblies is greater than a thickness of the OLED layer.

In the OLED panel of the present invention, the OLED layer includes a hole injection layer, a hole transport layer, a charge generation layer, a luminescent layer, an electron transport layer, and an electron injection layer which are sequentially disposed on each other.

In the OLED panel of the present invention, the OLED devices are arranged in a matrix, whereby the OLED devices are arranged in a row along a first direction and arranged in a column along a second direction. A first spacing between two of the OLED devices in the first direction is less than a second spacing between two of the OLED devices in the second direction.

The isolator assemblies are disposed at two sides of the white light-emitting device in the first direction.

In the OLED panel of the present invention, the OLED panel further includes an auxiliary cathode layer. The auxiliary cathode layer is disposed at two ends of each of the OLED devices in the row and is extending in the same direction as the first direction.

Each of the isolator assemblies is disposed on the pixel-defining layer among the notches.

In the OLED panel of the present invention, the white light-emitting device, the OLED layer between two adjacent OLED devices, and the anode are isolated by the isolator assemblies in the first direction.

In the OLED panel of the present invention, the anode is electrically connected to the auxiliary cathode layer.

In the OLED panel of the present invention, the length of each of the isolator assemblies is greater than or equal to a length of the white light-emitting device.

In the OLED panel of the present invention, each of the isolator assemblies is strip-shaped, and the longitudinal cross-sectional shape of each of the isolator assemblies has a wide top and a narrow bottom.

In the OLED panel of the present invention, the longitudinal cross-section shape of each of the isolator assemblies is inverted-trapezoid-shaped or T-shaped.

In the OLED panel of the present invention, the auxiliary cathode layer is made of a material selected from the group consisting of Al, Cu, and Ag.

In contrast to a conventional OLED panel, the OLED panel of the present invention provides a plurality of isolator assemblies disposed around a white light-emitting device. The isolator assemblies are configured to block the OLED layer located on the white light-emitting device from extending to the OLED devices adjacent to the white light-emitting device, thereby preventing light generated by the white light-emitting device from leaking. The OLED panel of the present invention has solved the technical problem that a structure of the conventional OLED panel is prone to light leakage.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
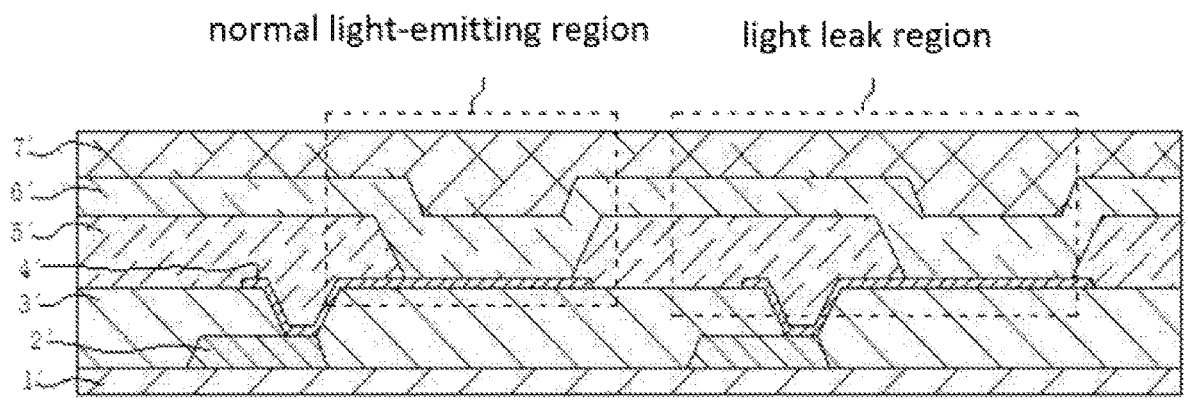
FIG. 1 is a schematic structural diagram of a conventional organic light emitting diode (OLED) panel.

The embodiments of the present disclosure are described in detail hereinafter. Examples of the described embodiments are given in the accompanying drawings, wherein the identical or similar reference numerals constantly denote the identical or similar elements or elements having identical or similar functions. The specific embodiments described with reference to the attached drawings are all exemplary and are intended to illustrate and interpret the present disclosure, which shall not be construed as causing limitations to the present disclosure.

Figure 2:
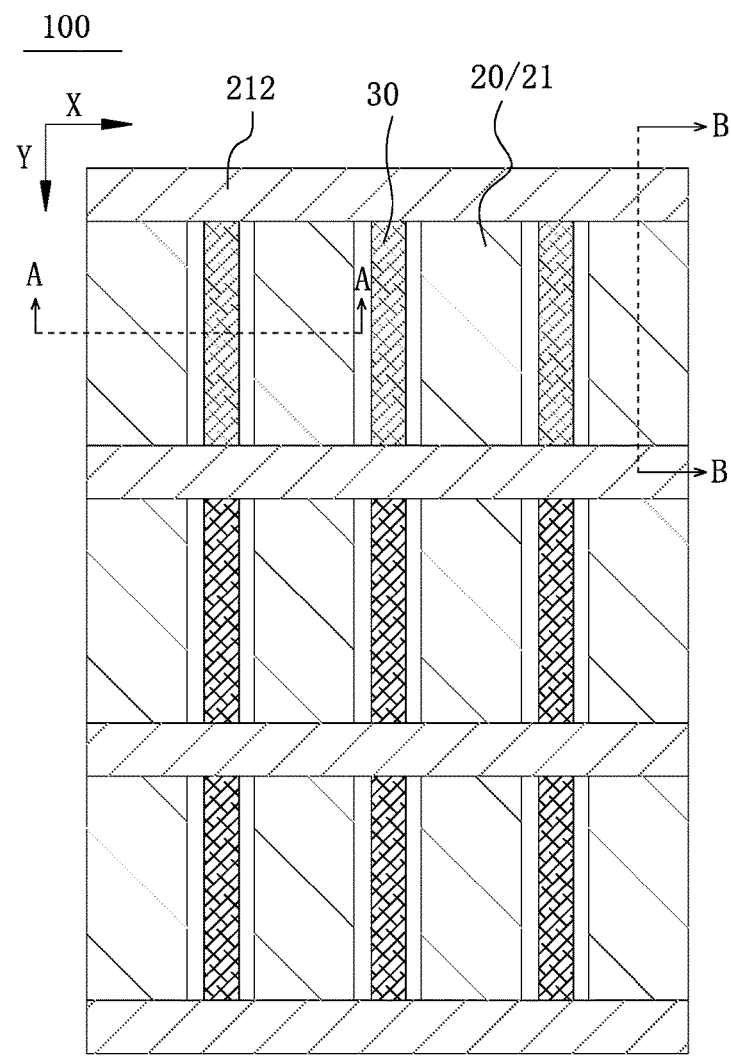
FIG. 2 is a schematic structural diagram in a top view of an OLED panel according to an embodiment of the present invention.
Figure 3:
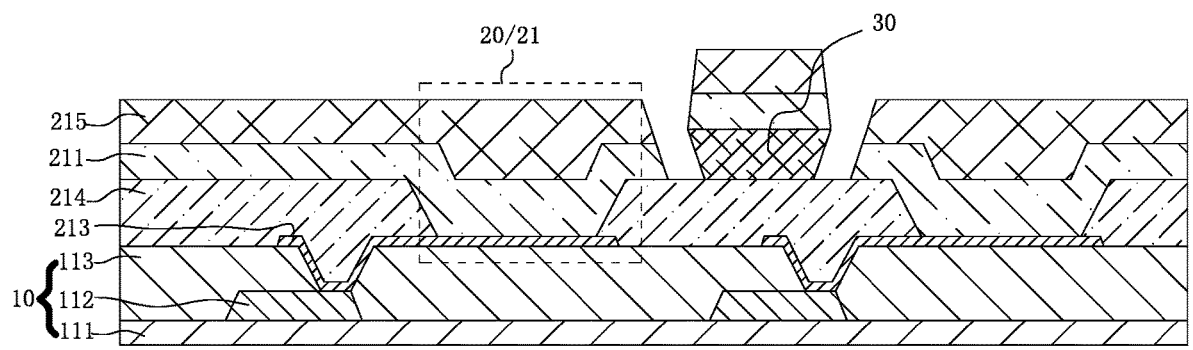
FIG. 3 is a schematic cross-sectional structural diagram along line AA of FIG. 2.

Referring to FIG. 2 and FIG. 3, FIG. 2 is a schematic structural diagram of a top view of an organic light-emitting diode (OLED) panel according to an embodiment of the present invention, and FIG. 3 is a schematic cross-sectional structural diagram along line AA of FIG. 2.

The present embodiment provides an OLED panel 100, comprising: a thin film transistor (TFT) array substrate 10, a plurality of OLED devices 20, and a plurality of isolator assemblies 30.

The TFT array substrate 10 includes a plurality of pixel regions spaced apart from each other. The plurality of OLED devices 20 are disposed on locations corresponding to the pixel regions respectively. Each of the OLED devices 20 includes a white light-emitting device 21, and the isolator assemblies 30 are disposed around the white light-emitting device 21.

The OLED panel 100 further includes an OLED layer 211, and the isolator assemblies 30 are configured to block the OLED layer 211, located on the white light-emitting device 21, from extending to the OLED devices 20 adjacent to the white light-emitting device 21.

In the OLED panel 100 of the present embodiment, the isolator assemblies 30 are disposed around the white light-emitting device 21. The isolator assemblies 30 are configured to block the OLED layer 211, located on the white light-emitting device 21, from extending to the OLED devices 20 adjacent to the white light-emitting device 21, thereby preventing light generated by the white light-emitting device 21 from leaking.

In the process of manufacturing the OLED panel 100, first, the isolator assembly 30 are disposed on a pixel-defining layer 214. Then, the OLED layer 211 is formed on the pixel-defining layer 214. Because the isolator assemblies 30 are first disposed on the pixel-defining layer 214, the OLED layer 211 at two sides of each isolator assembly 30 is disconnected. As a result, carries in the OLED layer 211 disposed on the white light-emitting device 21 are blocked from moving to the OLED devices 20 adjacent to the white light-emitting 21 by the isolator assemblies 30, thereby preventing light, generated by the white light-emitting device 21, from leaking.

In the present embodiment, all of the OLED devices 20 are white light-emitting devices 21, but are not limited thereto. That is to say, the OLED devices 20 may include other devices, such as a red light-emitting device, a green light-emitting device, and a blue light-emitting device. When all of the OLED devices 20 are white light-emitting devices 21, each of the isolator assemblies 30 is disposed between every two adjacent white light-emitting devices.

A height of each of the isolator assemblies 30 is greater than a thickness of the OLED layer 211, thereby ensuring that the OLED layer 211 at two sides of each of the isolator assemblies 30 is disconnected.

Specifically, each of the isolator assemblies 30 is strip-shaped, and the longitudinal cross-sectional shape of each of the isolator assemblies 30 has a wide top and a narrow bottom. For example, the longitudinal cross-sectional shape of each of the isolator assemblies 30 is inverted-trapezoid-shaped or T-shaped.

A length of each of the isolator assemblies 30 is greater than or equal to a length of the white light-emitting device 21, thereby ensuring that the OLED layer 211 at two sides of each of the isolator assemblies 30 is disconnected.

In the OLED panel 100 of the present invention, the OLED layer 211 includes a hole injection layer, a hole transport layer, a charge generation layer, a luminescent layer, an electron transport layer, and an electron injection layer which are sequentially disposed on each other. When the OLED panel 100 emits light, carriers are generated in the charge generation layer. The luminescent layer is made of organic light-emitting materials. The luminescent layers in different OLED devices 20 contain different organic light-emitting materials. For example, the luminescent layer in the white light-emitting device 21 contains a white organic light-emitting material, and the luminescent layer in the red light-emitting device contains a red organic light-emitting material.

In the OLED panel 100 of the present invention, the OLED devices 20 are arranged in a matrix, which means the OLED devices 20 are arranged in a row along a first direction (X-direction) and arranged in a column along a second direction (Y-direction). A first spacing between two of the OLED devices in the first direction (X-direction) is less than a second spacing between two of the OLED devices in the second direction (Y-direction).

The isolator assemblies 30 are disposed at two sides of the white light-emitting device in the first direction (X-direction).

When the OLED panel 100 emits light, because the mobility of carriers in the charge generation layer of the white light-emitting device 21 is high, carriers are prone to migrate. The smaller the distance between the OLED devices 20, the more easily light leakage occurs. By arranging an isolator assembly 30 between the OLED devices 20 which have small spacings therebetween, light leakage is prevented effectively. As a result, the isolator assemblies 30 are disposed at two sides of the white light-emitting device 21 along the first direction (X-direction).

Figure 4:
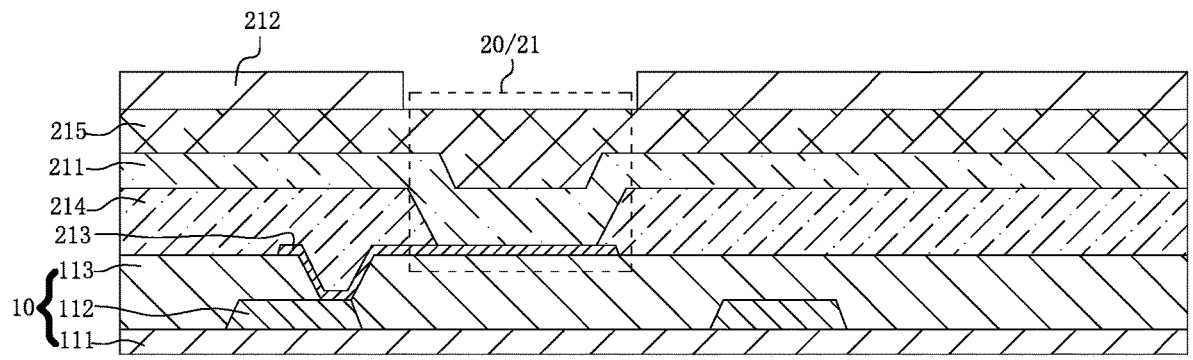
FIG. 4 is a schematic cross-sectional structural diagram along line BB of FIG. 2.

Referring to FIG. 2 and FIG. 4, FIG. 4 is a schematic cross-sectional structural diagram along line BB of FIG. 2. In the OLED panel 100 of the present embodiment, the OLED panel 100 further comprises an auxiliary cathode layer 212. The auxiliary cathode layer 212 is disposed at two ends of each of the OLED devices in the row and is extending in the same direction as the first direction (X-direction).

An anode 215 is electrically connected to the auxiliary cathode layer 212. Due to the arrangement of the auxiliary cathode layer 212, the voltage drop of the OLED panel 100 is reduced. The auxiliary cathode layer 212 comprises a plurality of strip-shaped traces, and each of the OLED devices 20 is disposed between two of the strip-shaped traces. An extending direction of the traces is perpendicular to an extending direction (X-direction) of the isolator assemblies 30.

In the OLED panel 100 of the present embodiment, the auxiliary cathode layer 212 is made of a material with good conductivity or high thickness. For example, the auxiliary cathode layer 212 is made of a material selected from the group consisting of AL, Cu, and Ag.

Specifically, in the OLED panel 100 of the present embodiment, the OLED panel 100 includes the TFT array substrate 10, a cathode 213, a pixel-defining layer 214 with a plurality of notches, the plurality of isolator assemblies 30, the OLED layer 211, the anode 215, and the auxiliary cathode layer 212 which are sequentially disposed on each other. Each of the isolator assemblies 30 is disposed on the pixel-defining layer among the notches.

In a layered structure of the OLED panel 100 of the present embodiment, the TFT array substrate 10 includes a substrate 111, a TFT 112 disposed on the substrate 111, and a planarization layer 113 disposed on the TFT 112. The cathode 213 is disposed on the planarization layer 113 and is electrically connected to the TFT 112. The OLED devices 20 are formed among the cathode 213, the pixel-defining layer 214, the OLED layer 211 and the anode 215.

In the OLED panel 100 of the present embodiment, the white light-emitting device 21, the OLED layer 212 between two adjacent OLED devices 20, and the anode 215 are isolated by the isolator assembly 30 in the first direction (X-direction).

Taking white light-emitting OLED device as an example, a manufacturing process of the OLED panel 100 of the present embodiment includes steps of:

Step 1, providing a substrate 111, and sequentially forming a barrier layer, a gate layer, a first insulating layer, an active layer, a second insulating layer, a source/drain layer, an interlayer dielectric layer, the planarization layer 113, the cathode 213, and the pixel-defining layer 214 on the substrate 111. The TFT array substrate 10 is formed by a combination of the substrate 111, the barrier layer, the gate layer, the first insulating layer, the active layer, the second insulating layer, the source/drain layer, the interlayer dielectric layer, and the planarization layer 113.

Step 2, forming an inverted-trapezoid and strip-shaped isolator assembly 30 on the pixel-defining layer 214 in the first direction (X-direction).

Step 3, forming an OLED layer 211 covering the whole pixel-defining layer 214, and then forming the anode 215 on the OLED layer 211. Due to the arrangement of the isolator assembly 30, the anode 215 and the OLED layer 211 at two sides of the isolator assembly 30 are isolated.

Step 4, forming an auxiliary cathode layer 212 on the anode 215 in a direction (first direction) perpendicular to an extending direction of the isolator assembly 30.

Finally, encapsulating the OLED panel 100, and the manufacturing process is completed.

In contrast to a conventional OLED panel, the OLED panel of the present invention provides a plurality of isolator assemblies disposed around a white light-emitting device. The isolator assemblies are configured to block the OLED layer located on the white light-emitting device from extending to the OLED devices adjacent to the white light-emitting device, thereby preventing light generated by the white light-emitting device from leaking. The OLED panel of the present invention has solved the technical problem that a structure of the conventional OLED panel is prone to light leakage.

To sum up, it is understood that many changes and modifications to the described embodiment can be carried out without departing from the scope and the spirit of the disclosure, and all such changes and modifications are intended to be included within the scope of the appended claims.

What is claimed is:

1. An organic light-emitting diode (OLED) panel, comprising:
   a thin film transistor (TFT) array substrate, wherein the TFT array substrate comprises a plurality of pixel regions spaced apart from each other;
   a plurality of OLED devices disposed on locations corresponding to the pixel regions respectively, wherein each of the OLED devices comprises:
   a white light-emitting device; and
   a plurality of isolator assemblies disposed around the white light-emitting device;
   wherein the OLED panel further comprises an OLED layer, and the isolator assemblies are configured to block the OLED layer located on the white light-emitting device beside a side of the isolator assemblies from extending to the OLED devices beside another side of the isolator assemblies;
   wherein a height of each of the isolator assemblies is greater than a thickness of the OLED layer; and wherein the OLED layer comprises a hole injection layer, a hole transport layer, a charge generation layer, a luminescent layer, an electron transport layer, and an electron injection layer which are sequentially disposed on each other.

2. The OLED panel of claim 1, wherein the OLED devices are arranged in a matrix, which means the OLED devices are arranged in a row along a first direction and arranged in a column along a second direction;
wherein a first spacing between two of the OLED devices in the first direction is less than a second spacing between two of the OLED devices in the second direction; and
wherein the isolator assemblies are disposed at two sides of the white light-emitting device in the first direction.

3. The OLED panel of claim 2, wherein the OLED panel further comprises an auxiliary cathode layer, wherein the auxiliary cathode layer is disposed at two ends of each of the OLED devices in the row and is extending in the same direction as the first direction.

4. The OLED panel as claim 3, wherein the OLED panel comprises:
the TFT array substrate, an anode, a pixel-defining layer having a plurality of notches, the plurality of isolator assemblies, the OLED layer, a cathode, and the auxiliary cathode layer which are sequentially disposed to each other;
wherein each of the isolator assemblies is disposed on the pixel-defining layer among the notches.

5. The OLED panel of claim 4, wherein the white light-emitting device, the OLED layer between two adjacent OLED devices and the anode are isolated by the isolator assemblies in the first direction.

6. The OLED panel of claim 4, wherein the anode is electrically connected to the auxiliary cathode layer.

7. The OLED panel of claim 5, wherein the height of each of the isolator assemblies is greater than or equal to a length of the white light-emitting device.

8. The OLED panel of claim 1, wherein each of the isolator assemblies is strip-shaped, and the longitudinal cross-sectional shape of each of the isolator assemblies has a wide top and a narrow bottom.

9. An organic light-emitting diode (OLED) panel, comprising:
a thin film transistor (TFT) array substrate, wherein the TFT array substrate comprises a plurality of pixel regions spaced apart from each other;
a plurality of OLED devices disposed on locations corresponding to the pixel regions respectively, wherein each of the OLED devices comprises:
a white light-emitting device; and
a plurality of isolator assemblies disposed around the white light-emitting device;
wherein the OLED panel comprises an OLED layer, and the isolator assemblies are configured to block the OLED layer located on the white light-emitting device beside a side of the isolator assemblies from extending to the OLED devices beside another side of the isolator assemblies.

10. The OLED panel of claim 9, wherein a height of each of the isolator assemblies is greater than a thickness of the OLED layer.

11. The OLED panel of claim 9, wherein the OLED layer comprises a hole injection layer, a hole transport layer, a charge generation layer, a luminescent layer, an electron transport layer, and an electron injection layer which are sequentially disposed on each other.

12. The OLED panel of claim 9, wherein the OLED devices are arranged in a matrix, whereby the OLED devices are arranged in a row along a first direction and arranged in a column along a second direction;
wherein a first spacing between two of the OLED devices in the first direction is less than a second spacing between two of the OLED devices in the second direction; and
wherein the isolator assemblies are disposed at two sides of the white light-emitting device in the first direction.

13. The OLED panel of claim 12, wherein the OLED panel further comprises an auxiliary cathode layer, wherein the auxiliary cathode layer is disposed at two ends of each of the OLED devices in the row and is extending in the same direction as the first direction.

14. The OLED panel as claim 13, wherein the OLED panel comprises:
the TFT array substrate, an anode, a pixel-defining layer having a plurality of notches, the plurality of isolator assemblies, the OLED layer, a cathode, and the auxiliary cathode layer which are sequentially disposed on each other;
wherein each of the isolator assemblies is disposed on the pixel-defining layer among the notches.

15. The OLED panel of claim 14, wherein the white light-emitting device, the OLED layer between two adjacent OLED devices, and the anode are isolated by the isolator assemblies in the first direction.

16. The OLED panel of claim 14, wherein the anode is electrically connected to the auxiliary cathode layer.

17. The OLED panel of claim 15, wherein the height of each of the isolator assemblies is greater than or equal to a length of the white light-emitting device.

18. The OLED panel of claim 9, wherein each of the isolator assemblies is strip-shaped, and the longitudinal cross-sectional shape of each of the isolator assemblies has a wide top and a narrow bottom.

19. The OLED panel of claim 18, wherein the longitudinal cross-sectional shape of each of the isolator assemblies is inverted-trapezoid-shaped or T-shaped.

20. The OLED panel of claim 18, wherein the auxiliary cathode layer is made of a material selected from the group consisting of Al, Cu, and Ag.

* * * * *